US012755763B2

(12) United States Patent
Shin et al.

(10) Patent No.: US 12,755,763 B2
(45) **Date of Patent: *Oct. 6, 2026**

(54) SEMICONDUCTOR MEMORY DEVICE INCLUDING GLOBAL POWER RAILS AND MEMORY SYSTEM HAVING THE SAME

(71) Applicant: SAMSUNG ELECTRONICS CO., LTD., Suwon-si (KR)

(72) Inventors: Sanghak Shin, Seoul (KR); Woongdai Kang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 105 days.

This patent is subject to a terminal disclaimer.

(21) Appl. No.: 18/654,527

(22) Filed: May 3, 2024

(65) Prior Publication Data

US 2024/0282346 A1 Aug. 22, 2024

Related U.S. Application Data

(63) Continuation of application No. 17/813,715, filed on Jul. 20, 2022, now Pat. No. 12,009,048.

(30) Foreign Application Priority Data

Nov. 1, 2021 (KR) ........................ 10-2021-0147810

(51) Int. Cl.

*G11C 5/14* (2006.01)
*G11C 8/10* (2006.01)
*G11C 8/18* (2006.01)

(52) U.S. Cl.

CPC ................ *G11C 5/148* (2013.01); *G11C 8/10* (2013.01); *G11C 8/18* (2013.01)

(58) Field of Classification Search

CPC .. G11C 5/148; G11C 8/10; G11C 8/18; G11C 5/14; G11C 7/22; G11C 5/147;

(Continued)

(56) References Cited

U.S. PATENT DOCUMENTS 7,099,234 B2 * 8/2006 Parris ..................... G11C 5/144 365/236
9,230,636 B2 1/2016 Meinerzhagen et al.

(Continued)

FOREIGN PATENT DOCUMENTS

KR 10-2015-0112148 10/2015

*Primary Examiner* — Khamdan N. Alrobaie
(74) *Attorney, Agent, or Firm* — Morgan, Lewis & Bockius LLP

(57) ABSTRACT

A semiconductor memory device includes a first power supply unit configured to, in a normal mode of a high frequency operation, supply a first power from a first global power rail to a third global power rail and a fourth global power rail in a normal mode, and, in a standby mode of a high frequency option, supply the first power to the third global power rail and not supply the first power to the fourth global power rail, and, in a normal mode of a low frequency operation, supply a second power of a second global power rail to the third global power rail and the fourth global power rail, and, in a standby mode of a low frequency operation, supply the second power to the third global power rail and not supply the second power to the fourth global power rail.

20 Claims, 9 Drawing Sheets

(58) Field of Classification Search
CPC ....... G11C 11/4074; G11C 5/144; G11C 7/20; G11C 7/222; G06F 1/04; G06F 1/26
See application file for complete search history.

(56) References Cited

U.S. PATENT DOCUMENTS

| | | | | |
|---|---|---|---|---|
| 10,418,076 | B2 | 9/2019 | Meinerzhagen et al. | |
| 10,607,660 | B2 | 3/2020 | Kim et al. | |
| 10,885,947 | B2 * | 1/2021 | Kim | G11C 5/147 |
| 2008/0279017 | A1 | 11/2008 | Shimano et al. | |
| 2010/0321102 | A1 | 12/2010 | Kong et al. | |
| 2011/0025375 | A1 | 2/2011 | Takayanagi | |
| 2015/0280703 | A1 | 10/2015 | Jeon | |
| 2018/0181334 | A1 | 6/2018 | Radjai et al. | |
| 2019/0027195 | A1 * | 1/2019 | Kim | G11C 11/4074 |
| 2019/0027206 | A1 * | 1/2019 | Kim | G11C 11/4074 |
| 2023/0139579 | A1 | 5/2023 | Shin et al. | |

* cited by examiner

FIG. 6

| OPERATION \ SIGNAL | | DS1 | DS2 | S1 | S2 | S3 | S4 | S5 | S6 | SW1 | SW2 | SW3 | SW4 | SW5 | SW6 |
|---|---|---|---|---|---|---|---|---|---|---|---|---|---|---|---|
| HF | NM | 0 | 1 | 0 | 0 | 1 | 1 | 0 | 0 | ON | ON | OFF | OFF | ON | ON |
| | SM | 0 | 1 | 0 | 1 | 1 | 1 | 1 | 1 | ON | OFF | OFF | OFF | OFF | OFF |
| LF | NM | 1 | 0 | 1 | 1 | 0 | 0 | 0 | 0 | OFF | OFF | ON | ON | ON | ON |
| | SM | 1 | 0 | 1 | 1 | 0 | 1 | 1 | 1 | OFF | OFF | ON | OFF | OFF | OFF |

SEMICONDUCTOR MEMORY DEVICE INCLUDING GLOBAL POWER RAILS AND MEMORY SYSTEM HAVING THE SAME

CROSS-REFERENCE TO RELATED APPLICATION

This application is a continuation application of U.S. application Ser. No. 17/813,715, filed on Jul. 20, 2022, which claims priority under 35 U.S.C. § 119 to Korean Patent Application No. 10-2021-0147810, filed on Nov. 1, 2021, in the Korean Intellectual Property Office, the disclosures of which are incorporated by reference herein in their entirety.

TECHNICAL FIELD

The present disclosure relates to a semiconductor memory device and a memory system having the same.

DISCUSSION OF THE RELATED ART

Semiconductor devices such as smart phones, gaming systems, and the like, often include several components to facilitate user interaction with the devices, including general purpose processors, driving circuits, functional components such as camera systems, and memory. The memory may include a semiconductor memory device such as volatile memory, such as DRAM, as well as non-volatile memory, such as flash storage.

A semiconductor memory device includes a memory core, a peripheral circuit, and a power switching unit, and the peripheral circuit includes a plurality of control function blocks and a plurality of input and output function blocks.

SUMMARY

A semiconductor memory device according to the present disclosure may include a power switching unit which receives two or more different powers (for example, VDD2H, VDD2L, etc., where VDD2H has a level greater than VDD2L) and variably switches powers supplied to the plurality of control function blocks and the plurality of input and output function blocks according to a frequency. For example, the power switching unit may supply a high power VDD2H during a high frequency operation and supply a low power VDD2L during a low frequency operation.

Embodiments of the disclosure provide a semiconductor memory device capable of reducing a leakage current by efficiently switching two or more different powers in a standby mode, and a memory system having the same.

Objects of the present disclosure are not limited to the aforementioned objects, and other unmentioned objects will be clearly understood by those skilled in the art based on the following description of the disclosure.

In accordance with an embodiment of the disclosure, a semiconductor memory device includes: a first power supply unit configured to: during a normal mode of a high frequency operation, supply a first power from a first global power rail to a third global power rail and to a fourth global power rail, during a standby mode of the high frequency operation, supply the first power to the third global power rail and not supply the first power to the fourth global power rail, during a normal mode of a low frequency operation, supply a second power from a second global power rail to the third global power rail and the fourth global power rail, and during a standby mode of the low frequency operation, supply the second power to the third global power rail and not supply the second power to the fourth global power rail; and a second power supply unit configured to: during both the normal mode of the high frequency operation and the normal mode of the low frequency operation, supply a first internal power from the third global power rail to a plurality of first local power rails and to supply a second internal power from the fourth global power rail to a plurality of second local power rails, and during both the standby mode of the high frequency operation and the standby mode of the low frequency operation, not supply the first internal power to the plurality of first local power rails and not supply the second internal power to the plurality of second local power rails, wherein a level of the first power is greater than that of the second power.

In accordance with an embodiment of the disclosure, a semiconductor memory device includes: a command and address generator configured to receive a combined command and address signal, to generate a mode set code together with a mode set command, and to generate a power down command related to a standby mode; a mode set register configured to receive the mode set code in response to the mode set command, and to set a first power control signal and a second power control signal; a control signal generator configured to receive the first power control signal and the second power control signal, and to generate first through sixth power switching control signals; a first power supply unit configured to: during a normal mode of a high frequency operation, supply a first power from a first global power rail to a third global power rail in response to the first power switching control signal and to supply the first power to a fourth global power rail in response to a second power switching control signal, responsive to a power down command generated during the high frequency operation, supply the first power to the third global power rail in response to the first power switching control signal and not supply the first power to the fourth global power rail in response to the second power switching control signal, during the normal mode of a low frequency operation, supply a second power of a second global power rail to the third global power rail in response to a third power switching control signal and to supply the second power to the fourth global power rail in response to a fourth power switching control signal and responsive to a power down command generated during the low frequency operation, supply the second power to the third global power rail in response to the third power switching control signal and not to supply the second power to the fourth global power rail in response to the fourth power switching control signal; a second power supply unit configured to: during the normal mode of the high frequency operation, supply a first internal power of the third global power rail to a plurality of first local power rails in response to a fifth power switching control signal and to supply a second internal power of the fourth global power rail to a plurality of second local power rails in response to the sixth power switching control signal, and responsive to a power down command generated during the high frequency operation or the low frequency operation, not supply the first internal power to the plurality of first local power rails in response to the fifth power switching control signal and not to supply the second internal power to the plurality of second local power rails in response to the sixth power switching control signal; a first circuit unit connected to at least one among the plurality of first local power rails, and configured to: during the normal mode of the high frequency operation and the low frequency operation, be supplied with a third internal power of at least one among the plurality of first local power rails and to receive an input signal to generate a first output signal, and responsive to a power down command generated during the high frequency operation or the low frequency operation, be supplied with the first internal power to initialize the first output signal regardless of the input signal; and a second circuit unit connected to at least one among the plurality of second local power rails, and configured to: during the normal mode of the high frequency operation and the low frequency operation, be supplied with a fourth internal power of at least one among the plurality of second local power rails and to receive the first output signal to generate a second output signal, and responsive to a power down command generated during the high frequency operation or the low frequency operation; wherein a level of the first power is greater than that of the second power.

In accordance with an embodiment of the disclosure, a memory system includes: a control unit configured to receive a clock signal, a combined command and address signal, and to transmit and receive data; a power management unit configured to supply at least two powers comprising a first power and a second power; and a semiconductor memory device configured to be supplied with the at least two powers, and to transmit and receive the data in response to the clock signal and the combined command and address signal, and wherein the semiconductor memory device comprises: a first power supply unit configured to: during a normal mode of a high frequency operation, supply a first power from a first global power rail to a third global power rail and a fourth global power rail, during a standby mode of the high frequency operation, supply the first power to the third global power rail and not supply the first power to the fourth global power rail, during a normal mode of a low frequency operation, supply a second power from a second global power rail to the third global power rail and the fourth global power rail, and during a standby mode of the low frequency operation, supply the second power to the third global power rail and not supply the second power to the fourth global power rail; and a second power supply unit configured to: during the normal mode of the high frequency operation and during the normal mode of the low frequency operation, supply a first internal power from the third global power rail to a plurality of first local power rails and to supply a second internal power from the fourth global power rail to a plurality of second local power rails, and during the standby mode of the high frequency operation and during the standby mode of the low frequency operation, not supply the first internal power to the plurality of first local power rails and not supply the second internal power to the plurality of second local power rails, wherein a level of the first power is greater than a level of the second power.

BRIEF DESCRIPTION OF THE DRAWINGS

The above and other features of the present disclosure will become more apparent by describing in detail embodiments thereof with reference to the accompanying drawings, in which:

FIG. 6 is a table that describes a power switching operation of a power switching unit according to an embodiment of the inventive concept;

DETAILED DESCRIPTION OF EXEMPLARY EMBODIMENTS

Hereinafter, a semiconductor memory device and a memory system having the same according to embodiments of the inventive concept will be described with reference to the accompanying drawings.

Figure 1:
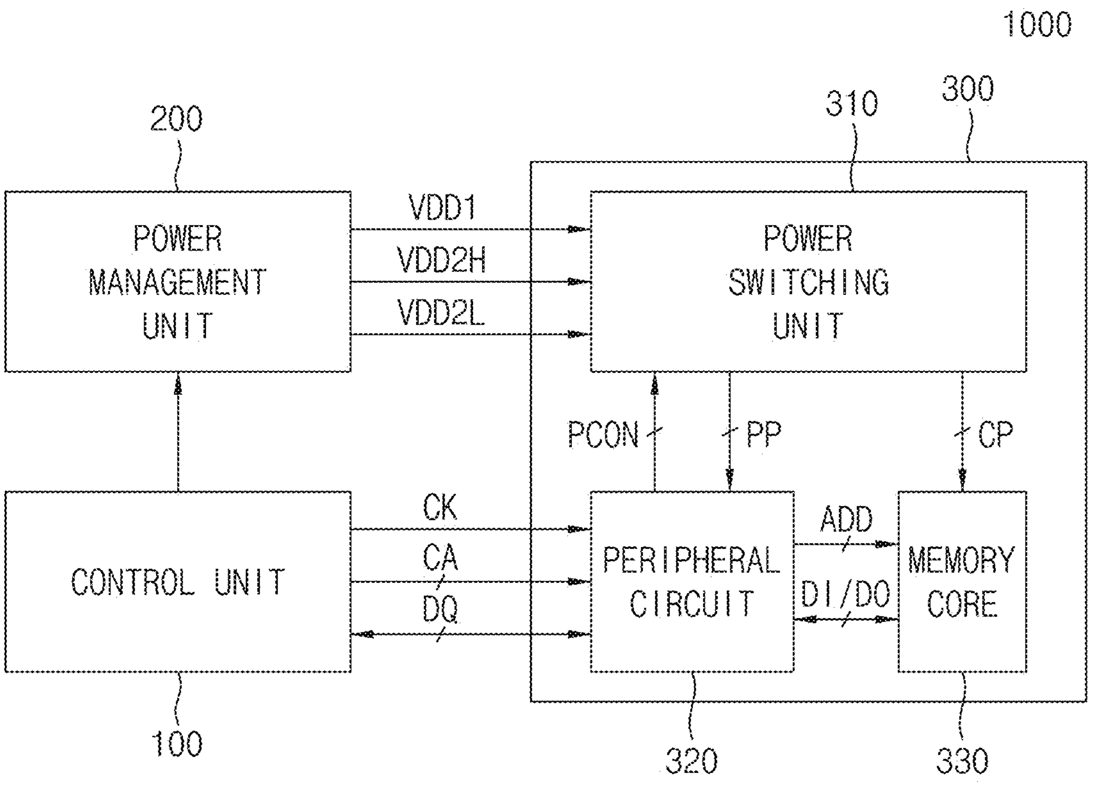
FIG. 1 is a block diagram that illustrates a memory system according to an embodiment of the inventive concept.

FIG. 1 is a block diagram that illustrates a memory system according to an embodiment of the inventive concept. The memory system 1000 may include a control unit 100, a power management unit 200, and a semiconductor memory device 300. The semiconductor memory device 300 may include a power switching unit 310, a peripheral circuit 320, and a memory core 330.

A function of each of the blocks shown in FIG. 1 will be described below.

The control unit 100 may provide a clock signal CK, and a command and address CA, and transmit and receive data DQ.

The power management unit 200 may supply three or more powers (for example, VDD1, VDD2H, VDD2L). In an embodiment, VDD1 carries a greater level of power than VDD2H, and VDD2H has a level greater than VDD2L.

The semiconductor memory device 300 may be supplied with the three or more powers, and transmit and receive the data DQ in response to the clock signal CK and the command and address CA.

The power switching unit 310 may be supplied with the three or more powers, and variably supply the three or more powers as a peripheral circuit power PP and a core power CP in response to a power switching control signal PCON.

The peripheral circuit 320 may be supplied with the peripheral circuit power PP, receive the clock signal CK, and the command and address CA to generate an address signal ADD (including a row address and a column address) and/or the power switching control signal PCON, and receive write data DI to generate data DQ or receive the data DQ to generate read data DO.

The memory core 330 may be supplied with the core power CP, and store the write data DI or output the read data DO in response to the address signal ADD.

Figure 2A:
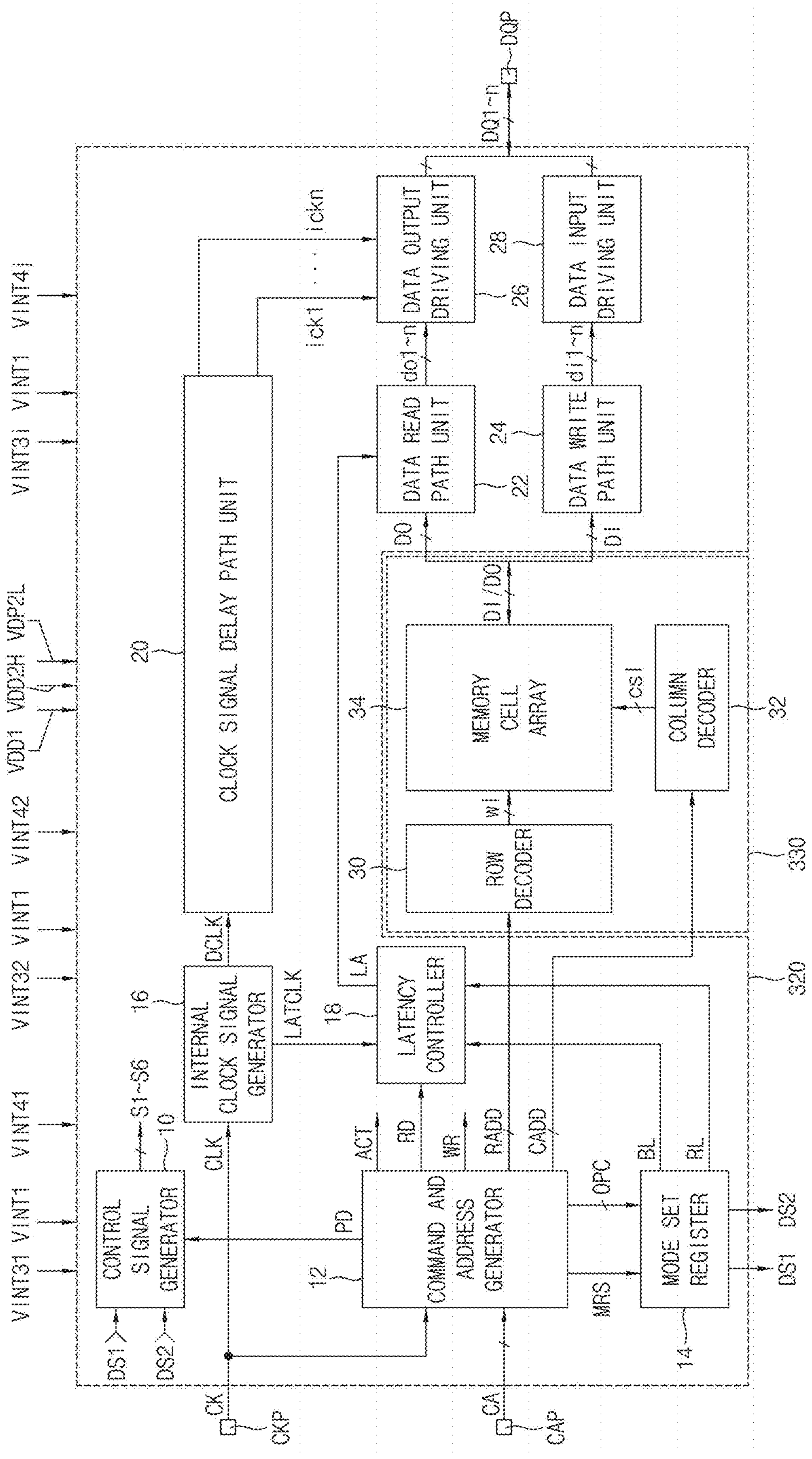
FIG. 2A is a block diagram that illustrates a configuration of a peripheral circuit and a memory core of a semiconductor memory device according to an embodiment of the inventive concept.

FIG. 2A is a block diagram that illustrates a configuration of a peripheral circuit and a memory core of a semiconductor memory device according to an embodiment of the inventive concept.

Referring to FIG. 2A, the peripheral circuit 320 may include a control signal generator 10, a command and address generator 12, a mode set register 14, an internal clock signal generator 16, a latency controller 18, a clock signal delay path unit 20, a data read path unit 22, a data write path unit 24, a data output driving unit 26, and a data input driving unit 28. The memory core 330 may include a row decoder 30, a column decoder 32, and a memory cell array 34. Further, the semiconductor memory device 300 may include a clock signal terminal CKP to which a clock signal CK is applied, command and address terminals CAP to which a command and address CA is applied, and data terminals DQP to or from which data DQ is input or output.

A function of each of the blocks of the peripheral circuit 320 shown in FIG. 2A will be described below.

The control signal generator 10 may receive a first power control signal DS1 and a second power control signal DS2 in response to a power down command PD, and generate a first power switching control signal S1 through a sixth power switching control signal S6. The first power switching control signal S1 through the sixth power switching control signal S6 may be included in the power switching control signal PCON shown in FIG. 1. For example, the first power switching control signal S1 through the sixth power switching control signal S6 may be output to power switching unit 310 (referring to FIG. 1). The control signal generator 10 may generate the first power switching control signal S1 through the sixth power switching control signal S6 when the power down command PD is not generated (e.g., not in a standby mode) and when the power down command PD is generated (e.g. in the standby mode). In some embodiments, the first power switching control signal S1 through the sixth power switching control signal S6 are independent of each other and/or different from each other.

The command and address generator 12 may decode a command signal included in the command and address CA in response to a clock signal CK, and generate a command (for example, an active command ACT, a read command RD, a write command WR, a mode set command MRS, or a power down command PD). Further, the command and address generator 12 may receive an address signal included in the command and address CA, and generate a row address RADD, a column address CADD, or a mode set code OPC. For example, when the command signal included in the command and address CA is the active command ACT, the address signal is generated as the row address RADD. When the command signal is the read command RD or the write command WR, the address signal is generated as the column address CADD. When the command signal is the mode set command MRS, the address signal is generated as the mode set code OPC.

The mode set register 14 may receive the mode set code OPC in response to the mode set command MRS, and set a burst length BL, a read latency RL, a first power control signal DS1, and a second power control signal DS2. The first power control signal DS1 and the second power control signal DS2 may be control signals related to a frequency, e.g., an operation frequency of the semiconductor memory device 300.

The internal clock signal generator 16 may receive the clock signal CK, and generate a delay clock signal DCLK delay-locked to the clock signal CK, and further generate a latency clock signal LATCLK.

The latency controller 18 may receive the read command RD in response to the latency clock signal LATCLK, and generate a latency control signal LA which is activated after the number of clock cycles corresponding to the read latency RL and is deactivated after the number of clock cycles corresponding to the burst length BL (after being activated).

The clock signal delay path unit 20 may transmit the delay clock signal DCLK, and generate n internal clock signals ick1 through ickn locked to the clock signal CLK.

The data read path unit 22 may convert the read data DO in serial to generate n output data do1 through don. The n output data do1 through don may be generated during an activation period of the latency control signal LA. For example, when 8n-bit read data DO is input, each of n output data do1 through don may be output eight times by 1 bit.

The data write path unit 24 may convert n input data di1 through din in parallel to generate the write data DI. For example, when each of n input data di1 through din is input eight times by 1 bit, 8n-bit write data DI may be generated.

In some embodiments, the data output driving unit 26 may include n data output drivers, and the n data output drivers are connected to the n data terminals DQP, respectively. The n data output drivers may drive the n output data do1 through don in response to the internal clock signals ick1 through ickn to generate the n data DQ1 through DQn.

In some embodiments, the data input driving unit 28 may include n data input drivers, and the n data input drivers are connected to the n data terminals DQP, respectively. The n data input drivers may drive the n data DQ1 through DQn to generate the n input data di1 through din.

A function of each of the blocks of the memory core 330 shown in FIG. 2A will be described below.

The row decoder 30 may decode the row address RADD to generate a plurality of word line selection signals wl.

The column decoder 32 may decode the column address CADD to generate a plurality of column selection signals csl.

The memory cell array 34 may include a plurality of memory cells, and output the read data DO from memory cells selected in response to the plurality of word line selection signals wl and the plurality of column selection signals csl or store the write data DI to the selected memory cells.

Figure 2B:
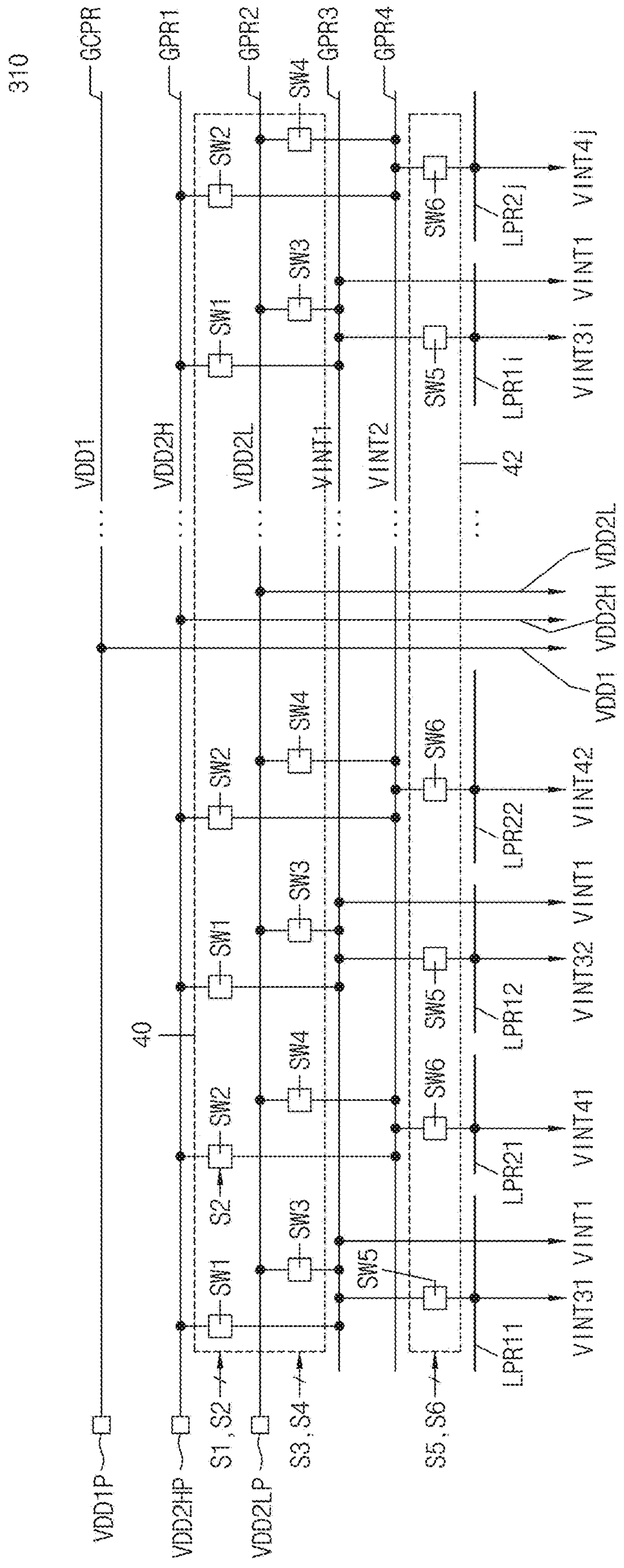
FIG. 2B is a block diagram that illustrates a configuration of a power switching unit of a semiconductor memory device according to an embodiment of the inventive concept.

FIG. 2B is a block diagram that illustrates a configuration of a power switching unit of a semiconductor memory device according to an embodiment of the inventive concept. The power switching unit 310 may include a first power supply unit 40 and a second power supply unit 42.

Referring to FIG. 2B, the semiconductor memory device 300 may include a core power terminal VDD1P to which a core power VDD1 is supplied, a first power terminal VDD2HP to which a first power VDD2H is supplied, a second power terminal VDD2LP to which a second power VDD2L is supplied, a core power rail GCPR connected to the core power terminals VDD1P and used to transmit the core power VDD1, a first global power rail GPR1 connected to the first power terminal VDD2HP and used to transmit the first power VDD2H, and a second global power rail GPR2 connected to the second power terminal VDD2LP and used to transmit the second power VDD2L. In an embodiment, the core power VDD1 may be a voltage of 1.1V, the first power VDD2H may be a voltage of 1.05V, and the second power VDD2L may be a voltage of 0.9V The semiconductor memory device 300 may further include a third global power rail GPR3, a fourth global power rail GPR4, i first local power rails LPR11 through LPR1*i*, and j second local power rails LPR21 through LPR2*j*.

During a high frequency operation, the first power supply unit 40 may supply the first power VDD2H of the first global power rail GPR1 to the third global power rail GPR3 and the fourth global power rail GPR4. In a standby mode, the first power supply unit 40 may supply the first power VDD2H to the third global power rail GPR3, and may not supply the first power VDD2H to the fourth global power rail GPR4. During a low frequency operation, the first power supply unit 40 may supply the second power VDD2L to the third global power rail GPR3 and the fourth global power rail GPR4, and in a standby mode, may supply the second power VDD2L to the third global power rail GPR3 and may not supply the second power VDD2L to the fourth global power rail GPR4.

The first power supply unit 40 may include a plurality of first switches SW1 which are connected between the first power rail GPR1 and the third global power rail GPR3 and controlled (for example, turned on/oft) in response to a first power switching control signal S1. The first power supply unit 40 may further include a plurality of second switches SW2 which are connected between the first global power rail GPR1 and the fourth global power rail GPR4 and controlled in response to a second power switching control signal S2. The first power supply unit 40 may further include a plurality of third switches SW3 which are connected between the second global power rail GPR2 and the third global power rail GPR3 and controlled in response to a third power switching control signal S3. The first power supply unit 40 may further include a plurality of fourth power switches SW4 which are connected between the second global power rail GPR2 and the fourth global power rail GPR4 and controlled in response to a fourth power switching control signal S4. The third global power rail GPR3 may transmit a first internal power VINT1, and the fourth global power rail GPR4 may transmit a second internal power VINT2. The first internal power VINT1 and the second internal power VINT2 may have a power level that is identical to the first power VDD2H or the second power VDD2L. The plurality of first switches SW1 and the plurality of second switches SW2 may be dynamic voltage and frequency scaling (DVFS) power switches.

During a high frequency operation and during a low frequency operation, the second power supply unit 42 may supply the first internal power VINT1 of the third global power rail GPR3 to the i first local power rails LPR11 through LPR1*i*, and may supply the second internal power VINT2 of the fourth global power rail GPR4 to the j second local power rails LPR21 through LPR2*j*, and in a standby mode, may not supply the first internal power VINT1 of the third global power rail GPR3 to the i first local power rails LPR11 through LPR1*i*, and may not supply the second internal power VINT2 of the fourth global power rail GPR4 to the j second local power rails LPR21 through LPR2*j*.

The second power supply unit 42 may include a plurality of fifth switches SW5 which are each connected between the third global power rail GPR3 and the i local power rails LPR11 through LPR1*i*, respectively, and which are controlled in response to a fifth power switching control signal S5. The second power supply unit 42 may further include a plurality of sixth switches SW6 which are each connected between the fourth global power rail GPR4 and the j second local power rails LPR21 through LPR2*j*, respectively, and which are controlled in response to a sixth power switching control signal S6. The i first local power rails LPR11 through LPR1*i* may transmit third internal powers VINT31 through VINT3*i*, respectively. The j second local power rails LPR21 through LPR2*j* may transmit fourth internal powers VINT41 through VINT4*j*, respectively. Voltage levels of the third internal powers VINT31 through VINT3*i* may be identical to each other, and be the same level as the first power VDD2H or the second power VDD2L. Voltage levels of the fourth internal powers VINT41 through VINT4*j* may be identical to each other, and be the same level as the first power VDD2H or the second power VDD2L.

In an embodiment, regardless of the first power switching control signal S1 through the sixth power switching control signal S6, the power switching unit 310 may fixedly supply the core power VDD1 and the first power VDD2H to the memory core 330, fixedly supply the first power VDD2H to the data output driving unit 26 and the data input driving unit 28, and fixedly supply the core power VDD1, the first power VDD2H, or the second power VDD2L to the command and address generator 12, the control signal generator 10, and the mode set register 14. In response to the first power switching control signal S1 through the sixth power switching control signal S6, the power switching unit 310 may or may not supply the third internal powers VINT31 through VINT3*i* and the fourth internal powers VINT41 through VINT4*j* to remaining peripheral circuits (for example, the internal clock signal generator 16, the latency controller 18, the clock signal delay path unit 20, the data read path unit 22, and the data write path unit 24).

Figure 3:
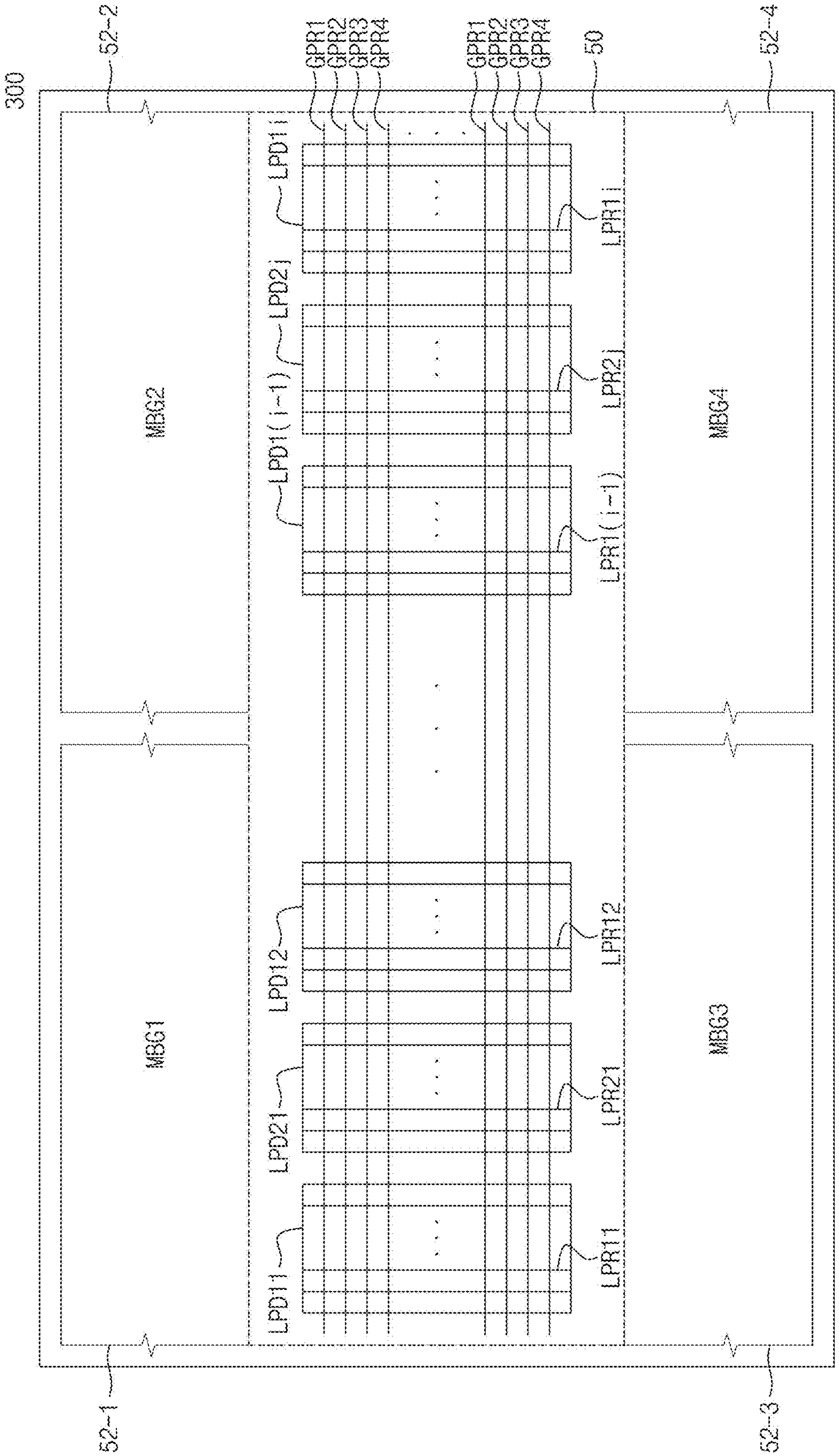
FIG. 3 is a diagram that illustrates an arrangement of power rails of a semiconductor memory device according to an embodiment of the inventive concept.
Figure 4:
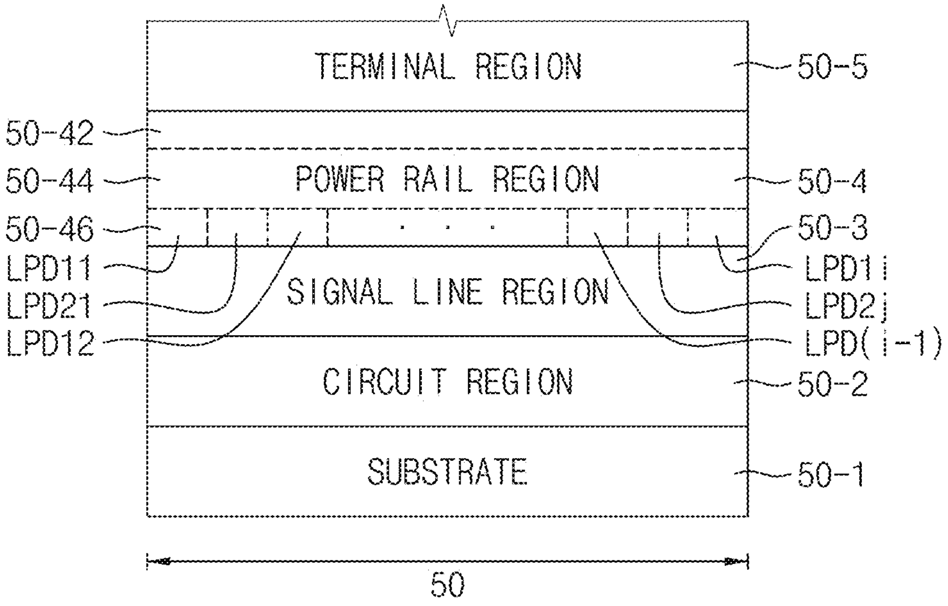
FIG. 4 is a diagram that illustrates a vertical arrangement of a semiconductor memory device according to an embodiment of the inventive concept.

FIG. 3 is a diagram that illustrates an arrangement of power rails of a semiconductor memory device according to an embodiment of the inventive concept, and FIG. 4 is a diagram that illustrates a vertical arrangement of a semiconductor memory device according to an embodiment of the inventive concept.

Referring to FIG. 3, the semiconductor memory device 300 may include a peripheral circuit region 50 in which the power switching unit 310 and the peripheral circuit 320 are arranged, and memory core regions 52-1 through 52-4 in which the memory core 330 is arranged.

An arrangement of the semiconductor memory device will be described below with reference to FIG. 2A to FIG. 4.

The memory cell array 34 may include four memory bank groups MBG1 through MBG4. The memory bank groups MBG1 through MBG4 may be arranged in the memory core regions 52-1 through 52-4, respectively. The row decoder 30 and the column decoder 32 for each of the memory bank groups MBG1 through MBG4 may be further arranged in the memory core regions 52-1 through 52-4.

The control signal generator 10, the command and address generator 12, the mode set register 14, the internal clock signal generator 16, the latency controller 18, the clock signal delay path unit 20, the data read path unit 22, the data write path unit 24, the data output driving unit 26, and the data input driving unit 28 may be arranged in the peripheral circuit region 50. Further, the first switches SW1 through the sixth switches SW6 may be arranged in the peripheral circuit region 50, and the first global power rail GPR1 through the fourth global power rail GPR4, the first local power rails LPR11 through LPR1*i*, and the second local power rails LPR21 through LPR2*j* may be arranged in the peripheral circuit region 50.

Referring to FIG. 4, the first switches SW1 through the sixth switched SW6 of the power switching unit 310 and circuits of the peripheral circuit 320 may be arranged in the circuit region 50-2 on a substrate 50-1. A signal line region 50-3 may be arranged on the circuit region 50-2, and a power rail region 50-4 may be arranged on the signal line region 50-3. The first global power rail GPR1 through the fourth global power rail GPR4, the first local power rails LPR11 through LPR1*i*, and the second local power rails LPR21 through LPR2*j* may be arranged in the power rail regions 50-4. Each of the first global power rail GPR1 through the fourth global power rail GPR4 may be globally arranged in a horizontal direction. In some embodiments, each of the first global power rail GPR1 through the fourth global power rail GPR4 may be arranged in a mesh shape in horizontal and vertical directions, and the rails arranged in the horizontal direction and the rails arranged in the vertical direction may be arranged on different layers. For example, the first global power rails GPR1 through the fourth global power rails GPR4 arranged in the horizontal direction may be arranged in the first power rail region 50-42, and the first global power rails GPR1 through the fourth global power rails GPR4 arranged in the vertical direction may be arranged in the second power rail region 50-44. The first local power rails LPR11 through LPR1*i* and the second local power rails LPR21 through LPR2*j* may be arranged in the third power rail region 50-46. The third power rail region 50-46 may include first local power regions LPD11 through LPD1*i* and second local power regions LPD21 through LPD2*j*, and the first local power regions LPD11 through LPD1*i* and the second local power regions LDP21 through LPD2*j* may be alternately arranged. The first local power rails LPR11 through LPR1*i* may be locally arranged in a vertical direction in the first local power regions LPD11 through LPD1*i*, respectively, and the second local power rails LPR21 through LPR2*j* may be locally arranged in the vertical direction in the second local power rail regions LPR21 through LPD2*j*, respectively. The plurality of first local power rails LPR11, LPR12, . . . , or LPR1*i* arranged in the vertical direction in each of the first local power regions LPD11 through LPD1*i* may be connected to each other at both ends (for example, top ends may be connected to bottom ends, etc.). On the other hand, the plurality of second local power rails LPR21, LPR22, . . . , or LPR2*j* arranged in the vertical direction in each of the second local power regions LPD21 through LPD2*j* may be connected to or may not be connected to each other at both ends.

Figure 5:
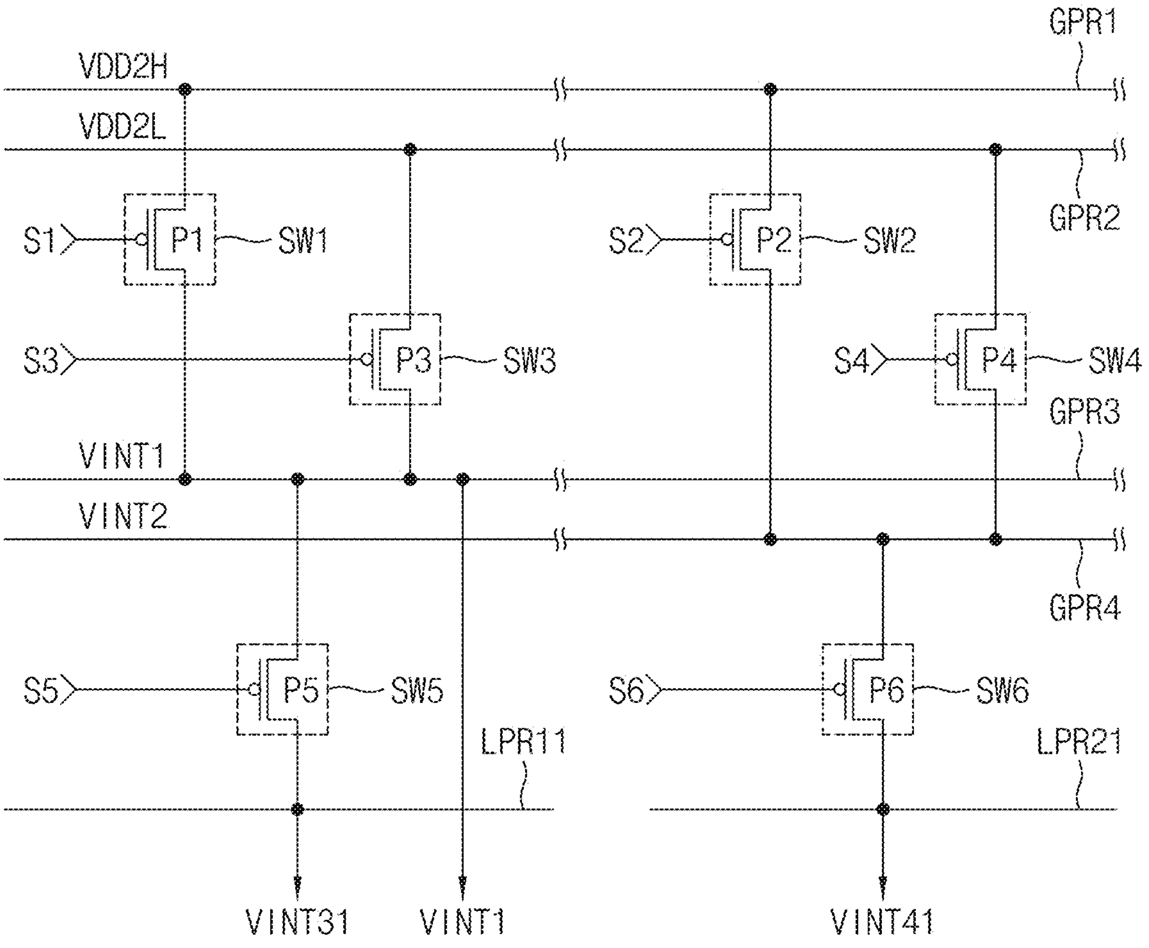
FIG. 5 is a diagram that illustrates a configuration of a power switching unit according to an embodiment of the inventive concept.

FIG. 5 is a diagram that illustrates a configuration of a power switching unit according to an embodiment of the inventive concept. Each of the first switches SW1 may be a first PMOS transistor P1, each of the second switches SW2 may be a second PMOS transistor P2, each of the third switches SW3 may be a third PMOS transistor P3, each of the fourth switches SW4 may be a fourth PMOS transistor P4, each of the fifth switches SW5 may a fifth PMOS transistor P5, and each of the sixth switches may be a sixth PMOS transistor P6.

An operation of the power switching unit shown in FIG. 5 will be described below.

Each of the first PMOS transistors P1 may be turned on in response to the first power switching control signal S1 having a "low" level, and once turned on, supply the first power VDD2H of the first global power rail GPR1 to the third global power rail GPR3. Each of the second PMOS transistors P2 may be turned on in response to the second power switching control signal S2 having a "low" level, and once turned on, supply the first power VDD2H of the first global power rail GPR1 to the fourth global power rail GPR4. Each of the third POMS transistors P3 may be turned on in response to the third power switching control signal S3 having a "low" level, and once turned on, supply the second power VDD2L of the second global power rail GPR2 to the third global power rail GPR3. Each of the fourth POMS transistors P4 may be turned on in response to the fourth power switching control signal S4 having a "low" level, and once turned on, supply the second power VDD2L of the second global power rail GPR2 to the fourth global power rail GPR4. Each of the fifth POMS transistors P5 may be turned on in response to the fifth power switching control signal S5 having a "low" level, and once turned on, supply the first internal power VINT1 of the third global power rail GPR3 to the first local power rails LPR11, LPR12, . . . , and LPR1*i*. Each of the sixth PMOS transistor P6 may be turned on in response to the sixth power switching control signal S6 having a "low" level, and once turned on, supply the second internal power VINT2 of the fourth global power rail GPR4 to the second local power rails LPR21, LPR22, . . . , and LPR2*j*.

For example, third internal powers VINT31 of the first local power rails LPR11, LPR12, . . . , LPR1*i* may be supplied to a part or all of the peripheral circuit 320 (for example, to the command and address generator 12, the internal clock signal generator 16, the latency controller 18, the clock signal delay path unit 20, the data read path unit 22, the data write path unit 24, the data output driving unit 26, or the data input driving unit 28), and fourth internal power VINT41 of the second local power rails LPR21, LPR22, . . . , LPR2*j* may be supplied to a remaining part or all of the peripheral circuit 320. Further, the first internal power VINT1 of the third global power rail GPR3 may be supplied to a part or all of the peripheral circuit 320.

Figure 7A:
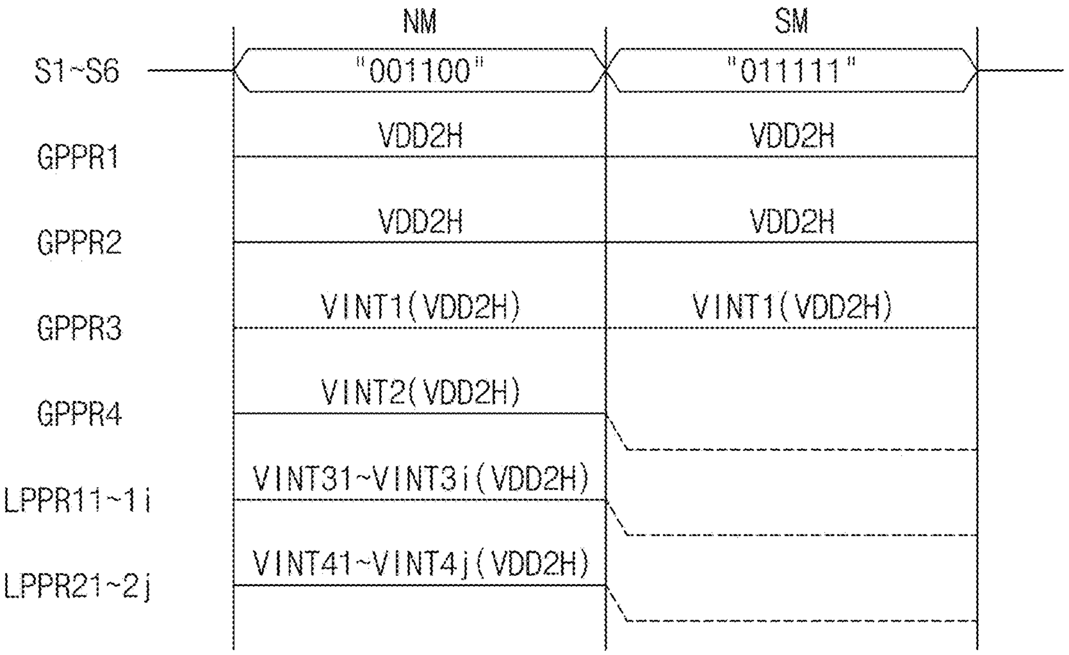
FIG. 7A and FIG. 7B are diagrams that illustrate levels of power rails according to a power switching operation according to an embodiment of the inventive concept.
Figure 7B:
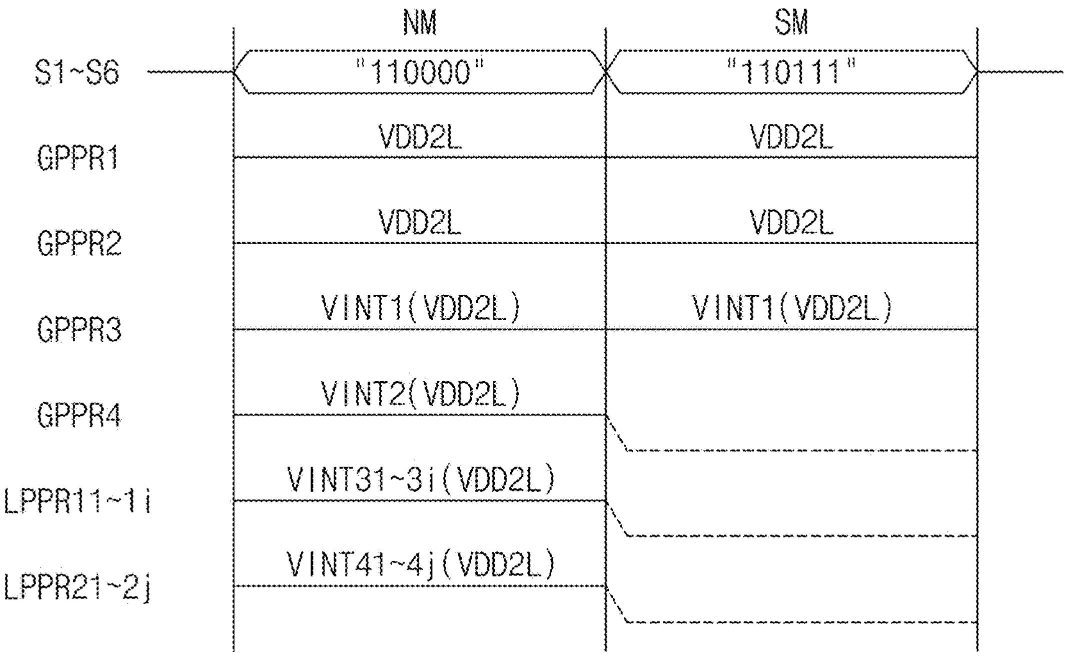

FIG. 6 is a table that describes a power switching operation of a power switching unit according to an embodiment of the inventive concept. FIG. 6 illustrates logic states of the first power control signal DS1, the second power control signal DS2, and the first power switching control signal S1 through the sixth power switching control signal S6, and on/off states of the first switches SW1 through the sixth switches SW6, in a normal mode NM (for example, during a write operation or a read operation in response to a write command WR or a read command RD) and in a standby mode SM (for example, during a power down operation in response to a power down command PD) within a high frequency operation HF and within a low frequency operation LF. FIG. 7A and FIG. 7B are diagrams that illustrate levels of power rails according to a power switching operation according to an embodiment of the inventive concept.

A power switching operation during the high frequency operation HF will be described below with reference to FIG. 2A to FIG. 7A.

During the high frequency operation HF, the first power control signal DS1 of the mode set register 14 may be set to a "low" level (e.g., a logic state "0"), and the second power control signal DS2 may be set to a "high" level (e.g., a logic state "1").

In the normal mode NM during the high frequency operation HF, the control signal generator 10 may generate the first power switching control signal S1 through the sixth power switching control signal S6 to be "001100". Accordingly, the first switches SW1, the second switches SW2, the fifth switches SW5, and the sixth switches SW6 may be turned on, and the third switches SW3 and the fourth switches SW4 may be turned off. The first PMOS transistors P1 and the second PMOS transistors P2 may be turned on, and thus the first power VDD2H of the first global power rail GPR1 may be supplied to the third global power rail GPR3 and the fourth global power rail GPR4. The fifth PMOS transistors P5 may be turned on, and thus the first internal power VINT1 of the third global power rail GPR3 may be supplied to the first local power rails LPR11 through LPR1*i*. The sixth PMOS transistors P6 may be turned on, and thus the second internal power VINT2 of the fourth global power rail GPR4 may be supplied to the second local power rails LPR21 through LPR2*j*.

In the standby mode SM during the high frequency operation HF, the control signal generator 10 may generate the first power switching control signal S1 through the sixth power switching control signal S6 to be "011111". Accordingly, the first switches SW1 may be turned on and the second switches SW2 through the sixth switches SW6 may be turned off. The first PMOS transistors P1 may be turned on, and thus the first power VDD2H of the first global power rail GPR1 may be supplied to the third global power rail GPR3. Power(s) may not supplied to the fourth global power rail GPR2, the first local power rails LPR11 through LPR1*i*, and the second local power rails LPR21 through LPR2*j*.

A power switching operation during the low frequency operation LF will be described below with reference to FIG. 2A to FIG. 7B.

During the low frequency operation LF, the first power control signal DS1 of the mode set register 14 may be set to a "high" level, and the second power control signal DS2 may be set to a "low" level.

In the normal mode during the low frequency operation LF, the control signal generator 10 may generate the first power switching control signal S1 through the sixth power switching control signal S6 to be "110000". Accordingly, the third switches SW3 to the sixth switches SW6 may be turned on, and the first switches SW1 and the second switches SW2 may be turned off. The third PMOS transistors P3 and the fourth PMOS transistors P4 may be turned on, and thus the second power VDD2L of the second global power rail GPR2 may be supplied to the third global power rail GPR3 and the fourth global power rail GPR4. The fifth PMOS transistors P5 may be turned on, and thus the first internal power VINT1 of the third global power rail GPR3 may be supplied to the first local power rails LPR11 through LPR1*i*. The sixth PMOS transistors P6 may be turned on, and thus the second internal power VINT2 of the fourth global power rail GPR4 may be supplied to the second local power rails LPR21 through LPR2*j*.

In the standby mode SM during the low frequency operation LF, the control signal generator 10 may generate the first power switching control signal S1 through the sixth power switching control signal S6 to be "110111". Accordingly, the third switches SW3 may be turned on, the first switches SW1, the second switches SW2, and the fourth switches SW4 through the sixth switches SW6 may be turned off. The third PMOS transistors P3 may be turned on, and thus the second power VDD2L of the second global power rail GPR2 may be supplied to the third global power rail GPR3. Power(s) may not be supplied to the fourth global power rail GPR4, the first local power rails LPR11 through LPR1*i*, and the second local power rails LPR21 through LPR2*j*.

As described above, in the standby mode SM during the low frequency operation LF and the high frequency mode HF, the first power VDD2H or the second power VDD2L may be supplied to the third global power rail GPR3, and the powers may not be supplied to the fourth global power rail GPR4, the first local power rails LPR11 through LPR1*i*, and the second local power rails LPR21 through LPR2*j*. Accordingly, a leakage current may be reduced. In this way, reliability and efficiency of the semiconductor memory device may be increased.

Figure 8:
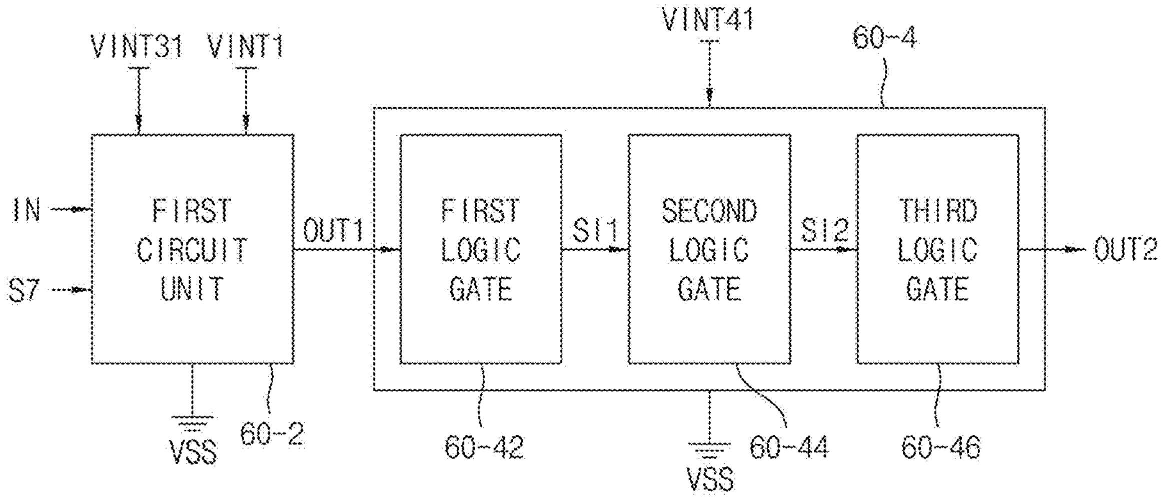
FIG. 8 is a block diagram that illustrates a configuration of a function block according to an embodiment of the inventive concept.

FIG. 8 is a block diagram that illustrates a configuration of a function block according to an embodiment of the inventive concept. The function block may correspond to at least one of the blocks included in the peripheral circuit 320 shown in FIG. 2. For example, the function block may be the internal clock signal generator 16, the latency controller 18, the clock signal delay path unit 20, the data read path unit 22, the data write path unit 24, the data output driving unit 26, and/or the data input driving unit 28. The function block may include a first circuit unit 60-2 and a second circuit unit 60-4. The second circuit unit 60-4 may include a first logic gate 60-42, a second logic gate 60-44, and a third logic gate 60-46.

Referring to FIG. 2A to FIG. 8, in a normal mode NM during either the high frequency operation HF or during the low frequency operation LF, the first circuit unit 60-2 may be connected between at least one among the i first local power rails LPR11 through LPR1*i* and a ground voltage VSS, may be supplied with one internal power VINT31 among i third internal powers VINT31 through VINT3*i*, and may receive an input signal IN to generate a first output signal OUT1. In the standby mode SM during the high frequency operation HF and during the low frequency operation LF, the first circuit unit 60-2 may be supplied with the first internal power VINT1, and may initialize the first output signal OUT1 to an initialization level regardless of the input signal IN in response to a seventh power switching control signal S7. For example, the first output signal OUT1 may be initialized to a "high" level. The seventh power switching control signal S7 may be further generated by the control signal generator 10.

The second circuit unit 60-4 may be connected between at least one among the j second local power rails LPR21 through LPR2*j* and a ground voltage VSS, and in the normal mode NM, may be supplied with one among j fourth internal powers VINT41 through VINT4*j*, and may receive the first output signal OUT1 to generate a second output signal OUT2. The second circuit unit 60-4 may not be supplied with the fourth internal power VINT41 in the standby mode SM. That is, the fourth internal power VINT41 may be cut, in the standby mode SM.

The first logic gate 60-42 may receive the first output signal OUT1 to generate a first signal SI1, the second logic gate 60-44 may receive the first signal SI1 to generate a second signal SI2, and the third logic gate 60-46 may receive the second signal SI2 to generate a second output signal OUT2.

The first logic gate of the second circuit unit 60-4 may not be supplied with the fourth internal power VINT41 while in the standby mode SM, but may initialize the first signal SI1 to an initialization level in response to the first output signal OUT1. For example, the first signal SI1 having a "low" level may be generated in response to the first output signal OUT1 having a "high" level.

Figure 9:
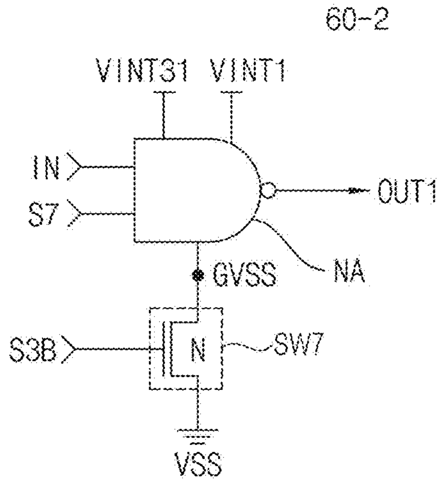
FIG. 9 is a diagram that illustrates a configuration of a first circuit unit according to an embodiment of the inventive concept.

FIG. 9 is a diagram that illustrates a configuration of a first circuit unit 60-2 according to an embodiment of the inventive concept. The first circuit unit 60-2 may include a NAND gate NA and a seventh switch SW7, and the seventh switch SW7 may include a NMOS transistor N.

Referring to FIG. 9, during the high frequency operation HF and during the low frequency operation LF, in the normal mode NM, the NMOS transistor N may be turned on in response to an inverted third power switching control signal S3B (a signal generated by inverting the third power switching control signal S3) to supply a ground voltage VSS to a virtual ground voltage node GVSS. In the standby mode SM, the NMOS transistor N may be turned off not to supply the ground voltage VSS to the virtual ground voltage node GVSS.

During the high frequency operation HF and during the low frequency operation LF, in the normal mode NM, the NAND gate NA may be supplied with one among the i third internal powers VINT31 through VINT3*i* and the ground voltage VSS, and invert the input signal IN to generate the first output signal OUT1 when the seventh power switching control signal S7 is at a "high" level. In the standby mode, the NAND gate NA may be supplied with the first internal power VINT1, and generate the first output signal OUT1 having a "high" level regardless of the input signal IN when the seventh power switching control signal S7 is at a "low" level.

Figure 10:
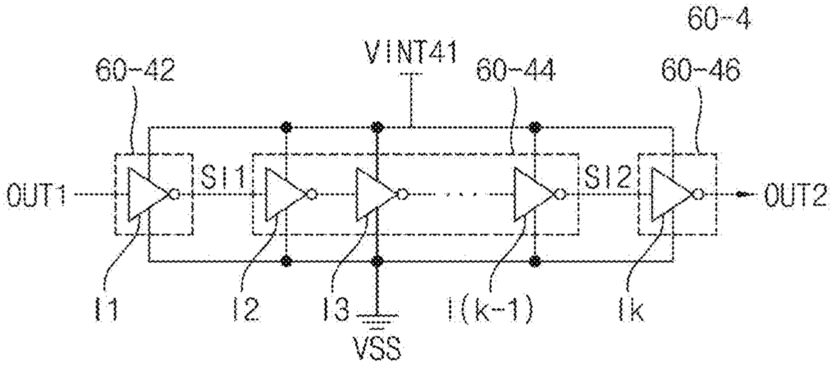
FIG. 10 is a diagram that illustrates a configuration of a second circuit unit according to an embodiment of the inventive concept.

FIG. 10 is a diagram that illustrates a configuration of a second circuit unit according to an embodiment of the inventive concept. The second circuit unit 60-2 may include k inverters I1 through Ik. The first logic gate 60-42 may include a first inverter I1, the second logic gate 60-44 may include a second inverter 12 through a (k−1)th inverter I(k−1), and the third logic gate 60-46 may include a kth inverter Ik.

Referring to FIG. 10, even when the fourth internal power VINT41 is not supplied in the standby mode SM, the first inverter I1 may generate the first signal SI1 having a "low" level in response to the first output signal OUT1 having a "high" level. The second inverter 12 through the kth inverter Ik may not be supplied with the fourth internal power VINT41 and may not perform an operation in the standby mode SM, and thus levels of output signals of the second inverter 12 through the (k−1)th inverter I(k−1), a level of the second signal SI2, and a level of the second output signal OUT2 may not be fixed and each be at a floating state. Accordingly, in the standby mode SM, a current leakage through the second circuit unit 60-4 may not occur.

The first circuit unit 60-2 and the second circuit unit 60-4 shown in FIG. 9 and FIG. 10 may be the clock signal delay path unit 20 shown in FIG. 2A. In this case, the input signal IN may be the delay clock signal DCLK, and the second output signal OUT2 may be one among the n internal clock signals ick1 through ickn.

As described above, in the standby mode SM, the first output signal OUT1 of the first circuit unit 60-2 may be initialized to a "high" level, and the first signal SI1 of the first logic gate 60-42 of the second circuit unit 60-4 may be initialized to a "low" level. Accordingly, in a wake-up operation of exiting from the standby mode SM, when the fourth internal power VINT41 is supplied, the level of the second signal SI2 of the second logic gate 60-44 and the level of second output signal OUT2 of the third logic gate 60-46 may be quickly recovered to normal levels based on the first signal SI1 having the "low" level of the first logic gate 60-42 of the second circuit unit 60-4. Therefore, in the wake-up operation, the semiconductor memory device may quickly exit from the standby mode SM.

According to embodiments of the inventive concept, in the semiconductor memory device and the memory system having the same, the first local power rails and the second local power rails connected to two global power rails different from each other are arranged, and the powers supplied to the first local power rails and the second local power rails are cut in the standby mode. Accordingly, the leakage current may be reduced and power consumption may be reduced, and a semiconductor memory device according to embodiments of the inventive concept may have increased efficiency.

Further, in the standby mode, the circuit unit of a part of the function block of the peripheral circuit of the semiconductor memory device may not be supplied with the internal power of the first local power rails in the standby mode, and may be supplied with an internal power of a corresponding global power rail to be initialized to an initialization level. Accordingly, in the wake-up operation, the output signals of all of the circuit units of the function block may be quickly recovered to the normal levels.

While the embodiments of the inventive concept have been described with reference to the accompanying drawings, it will be understood by those skilled in the art that various modifications may be made thereto without departing from the scope of the inventive concept and without changing essential features thereof. Therefore, the above-described embodiments should be considered in a descriptive sense only and not for the purposes of limitation.

What is claimed is:

1. A memory device comprising:

a first global power rail connected to a first power terminal that supplies a first power voltage;

a second global power rail connected to a second power terminal that supplies a second power voltage;

a third global power rail;

a fourth global power rail; and a power management circuit configured to receive a power down command from a controller, and change a normal mode of a high frequency operation into a standby mode of the high frequency operation in response to the power down command, wherein the power management circuit is configured to connect the first global power rail to the third global power rail and the fourth global power rail in the normal mode of the high frequency operation, and wherein the power management circuit is configured to connect the first global power rail to the third global power rail and disconnect the first global power rail from the fourth global power rail in the standby mode of the high frequency operation.

2. The memory device of claim 1, further comprising a mode set register configured to store data indicating the normal mode or the standby mode.

3. The memory device of claim 1, wherein the power management circuit is configured to connect the third global power rail to a plurality of first local power rails in the normal mode; and wherein the power management circuit is configured to connect the fourth global power rail to a plurality of second local power rails in the normal mode.

4. The memory device of claim 1, wherein the power management circuit is configured to disconnect the third global power rail from a plurality of first local power rails in the standby mode; and wherein the power management circuit is configured to disconnect the fourth global power rail from a plurality of second local power rails in the standby mode.

5. The memory device of claim 4, further comprising:

at least one first switch configured to connect the first global power rail to the third global power rail in response to a first power switching control signal;

at least one second switch configured to connect the first global power rail to the fourth global power rail in response to a second power switching control signal;

at least one third switch configured to connect the second global power rail to the third global power rail in response to a third power switching control signal;

at least one fourth switch configured to connect the second global power rail to the fourth global power rail in response to a fourth power switching control signal;

at least one fifth switch configured to connect the third global power rail to the plurality of the first local power rails in response to a fifth power switching control signal; and at least one sixth switch configured to connect the fourth global power rail to the plurality of the second local power rails in response to a sixth power switching control signal.

6. The memory device of claim 5, wherein the power management circuit comprises a control signal generator configured to generate the first power switching control signal to the sixth power switching control signal.

7. The memory device of claim 5, wherein at least one of the at least one first switch to the at least one of the sixth switch includes a PMOS transistor.

8. A memory device comprising:

a first global power rail connected to a first power terminal for supplying a first power voltage;

a second global power rail connected to a second power terminal for supplying a second power voltage;

a third global power rail;

a fourth global power rail; and a power management circuit configured to receive a power down command from a controller, and change a normal mode of a low frequency operation into a standby mode of the low frequency operation in response to the power down command related to the standby mode, wherein the power management circuit is configured to connect the second global power rail to the third global power rail and the fourth global power rail in the normal mode of the low frequency operation, and wherein the power management circuit is configured to connect the second global power rail to the third global power rail and disconnect the second global power rail from the fourth global power rail in the standby mode of the low frequency operation.

9. The memory device of claim 8, wherein the power management circuit is configured to connect the third global power rail to a plurality of first local power rails in the normal mode; and wherein the power management circuit is configured to connect the fourth global power rail to a plurality of second local power rails in the normal mode.

10. The memory device of claim 8, wherein the power management circuit is configured to disconnect the third global power rail from a plurality of first local power rails in the standby mode; and wherein the power management circuit is configured to disconnect the fourth global power rail from a plurality of second local power rails in the standby mode.

11. The memory device of claim 10, further comprising:

at least one first switch configured to connect the first global power rail to the third global power rail in response to a first power switching control signal;

at least one second switch configured to connect the first global power rail to the fourth global power rail in response to a second power switching control signal;

at least one third switch configured to connect the second global power rail to the third global power rail in response to a third power switching control signal;

at least one fourth switch configured to connect the second global power rail to the fourth global power rail in response to a fourth power switching control signal;

at least one fifth switch configured to connect the third global power rail to the plurality of the first local power rails in response to a fifth power switching control signal; and at least one sixth switch configured to connect the fourth global power rail to the plurality of the second local power rails in response to a sixth power switching control signal.

12. The memory device of claim 11, wherein the power management circuit comprises a control signal generator configured to generate the first power switching control signal to the sixth power switching control signal.

13. The memory device of claim 11, wherein at least one of the at least one first switch to the at least one sixth switch includes a PMOS transistor.

14. A memory device comprising:

a first switch configured to connect a first global power rail to a third global power rail in response to a first power switching control signal;

a second switch configured to connect the first global power rail to a fourth global power rail in response to a second power switching control signal;

a third switch configured to connect a second global power rail to the third global power rail in response to a third power switching control signal;

a fourth switch configured to connect the second global power rail to the fourth global power rail in response to a fourth power switching control signal a fifth switch configured to connect the third global power rail to a plurality of first local power rails in response to a fifth power switching control signal;

a sixth switch configured to connect the fourth global power rail to a plurality of second local power rails in response to a sixth power switching control signal; and a power management circuit configured to receive a power down command from a controller, change a normal mode into a standby mode in response to the power down command related to the standby mode, and generate the first power switching control signal to the sixth power switching control signal corresponding to the power down command.

15. The memory device of claim 14, wherein the power management circuit is configured to connect the first global power rail to the third global power rail and the fourth global power rail in the normal mode of a high frequency operation, wherein the power management circuit is configured to connect the first global power rail to the third global power rail and disconnect the first global power rail from the fourth global power rail in the standby mode of the high frequency operation.

16. The memory device of claim 15, wherein the power management circuit is configured to connect the third global power rail to the plurality of first local power rails in the normal mode; and wherein the power management circuit is configured to connect the fourth global power rail to the plurality of second local power rails in the normal mode.

17. The memory device of claim 15, wherein the power management circuit is configured to disconnect the third global power rail from the plurality of first local power rails in the standby mode; and wherein the power management circuit is configured to disconnect the fourth global power rail with the plurality of second local power rails in the standby mode.

18. The memory device of claim 15, wherein, in the normal mode of a low frequency operation, the power management circuit is configured to connect the second global power rail to the third global power rail and the fourth global power rail, and wherein, in the standby mode of the low frequency operation, the power management circuit is configured to connect the second global power rail to the third global power rail and disconnect the second global power rail from the fourth global power rail.

19. The memory device of claim 18, wherein the power management circuit is configured to connect the third global power rail to the plurality of first local power rails in the normal mode; and wherein the power management circuit is configured to connect the fourth global power rail to the plurality of second local power rails in the normal mode.

20. The memory device of claim 18, wherein the power management circuit is configured to disconnect the third global power rail from the plurality of first local power rails in the standby mode; and wherein the power management circuit is configured to disconnect the fourth global power rail to the plurality of second local power rails in the standby mode.

* * * * *